(12) United States Patent
Lee et al.

(10) Patent No.: US 6,804,163 B2
(45) Date of Patent: Oct. 12, 2004

(54) SEMICONDUCTOR MEMORY DEVICE FOR REDUCING CHIP SIZE

(75) Inventors: Yun-sang Lee, Yongin (KR); Jung-bae Lee, Yongin (KR)

(73) Assignee: Samsung Electronics Co., Ltd., Suwon (KR)

(*) Notice: Subject to any disclaimer, the term of this patent is extended or adjusted under 35 U.S.C. 154(b) by 12 days.

(21) Appl. No.: 10/305,986

(22) Filed: Nov. 29, 2002

(65) Prior Publication Data

US 2003/0174571 A1 Sep. 18, 2003

(30) Foreign Application Priority Data

Mar. 4, 2002 (KR) .................................... 2002-0011345

(51) Int. Cl.[7] ................................................ G11C 8/00
(52) U.S. Cl. ............................. 365/230.03; 365/230.06
(58) Field of Search ...................... 365/230.03, 230.06

(56) References Cited

U.S. PATENT DOCUMENTS 6,157,688 A * 12/2000 Tamura et al. ............... 375/348
6,377,658 B1 * 4/2002 Vermilyea et al. ........... 378/131

* cited by examiner

*Primary Examiner*—M. Tran
(74) *Attorney, Agent, or Firm*—Harness Dickey

(57) ABSTRACT

A semiconductor memory device that minimizes chip area is provided. The semiconductor memory device includes local input/output (I/O) lines, global I/O lines, and a memory core that is coupled between a bit line and a complementary bit line. The memory core includes a memory cell array, a bit line equalizer circuit, a PMOS sense amplifier (S/A), a PMOS S/A driving circuit for driving the PMOS S/A, a transmission gate circuit, an NMOS S/A, and an NMOS S/A driving circuit for driving the NMOS S/A. First and second transistors for connecting the local I/O lines to the global I/O lines are installed between adjacent bit lines. The PMOS S/A driving circuit, which is a first driving transistor, and the NMOS S/A driving circuit, which is a second driving transistor, are also installed between adjacent bit lines. Because the semiconductor memory device arranges a PMOS S/A driving circuit, an NMOS S/A driving circuit, and a gating circuit for connecting local I/O lines to global I/O lines, between adjacent bit lines, the chip area is reduced.

51 Claims, 6 Drawing Sheets

SEMICONDUCTOR MEMORY DEVICE FOR REDUCING CHIP SIZE

CROSS REFERENCE TO RELATED APPLICATIONS

This non-provisional application claims priority under 35 U.S.C. §119 to Korean Patent Application No. 2002-0011345 filed Mar. 4, 2002, the contents of which are incorporated by reference in its entirety.

BACKGROUND OF THE INVENTION

1. Field of the Invention

The present invention generally relates to the field of semiconductor devices. In particular, the present invention relates to a semiconductor memory device for reducing chip size by effectively arranging circuits for use in a semiconductor memory device that includes local input/output (I/O) lines and global I/O lines.

2. Description of the Related Art

With increases in the performance and integration density of semiconductor memory devices, efforts to reduce the chip area have been made not only on a process or circuit for manufacturing a semiconductor memory device but also in the field of circuit arranging methods, i.e., circuit layouts. The circuits used in a memory core are a repetition of identical circuits. As a result, the large layout of a certain circuit affects the entire chip size.

General dynamic random access memory (DRAM) uses local I/O lines and global I/O lines in order to achieve multiple input/output operations. A gating circuit composed of transistors is required to connect the local I/O lines to the global I/O lines. These transistors increase the layout of a memory device, thereby increasing the chip size.

Referring to FIGS. 1(a), 1(b) and 2, a conventional semiconductor device can best be seen. The conventional semiconductor memory device 100 is composed of a memory core and a gating circuit 140. The memory core is coupled between a bit line BL and a complementary bit line BLB, and includes a memory cell array 105, a bit line equalizer circuit 110, an isolation transistor 115, a PMOS sense amplifier (S/A) 120, a PMOS S/A driving circuit 125 for driving the PMOS S/A 120, a transmission gate circuit 130, an NMOS S/A 135, and an NMOS S/A driving circuit 145 for driving the NMOS S/A 135. The gating circuit 140 connects local I/O lines LIO and LIOB to global I/O lines GIO and GIOB.

The bit line equalizer circuit 110 is installed beside the memory cell array 105 and is followed by the isolation transistor 115 and the PMOS S/A 120. The PMOS S/A driving circuit 125 is installed next to the PMOS S/A 120. The PMOS S/A driving circuit 125 is a first driving transistor coupled between the PMOS S/A 120 and a supply voltage source (VCC). The transmission gate circuit 130 is installed beside the PMOS S/A driving circuit 125 and is followed by the gating circuit 140. The gating circuit 140 includes two transistors, MN1 and MN2, for connecting the local I/O lines LIO and LIOB to the global I/O lines GIO and GIOB. The NMOS S/A driving circuit 145 and the NMOS S/A 135 are installed beside the gating circuit 140. The NMOS S/A driving circuit 145 is an NMOS transistor coupled between the NMOS S/A 135 and a circuit ground. The isolation transistor 15 and the bit line equalizer circuit 110 are installed next to the NMOS S/A 135.

Because the structure and operation of each of the aforementioned circuits are generally known to those ordinarily skilled in the art, they will not be described in detail.

Referring now to FIGS. 1(a) and (b), it can be seen that the transistors MN1 and MN2 of the gating circuit 140 enlarge the layout of the conventional semiconductor memory device 100 toward the memory cell array 105. It can also be seen that the layout of the conventional semiconductor memory device 100 is enlarged toward the memory cell array 105 by the installation of the PMOS S/A driving circuit 125 and the NMOS S/A driving circuit 145. Such an enlargement of the semiconductor memory device 100 occurs because the transistors MN1 and MN2 of the gating circuit 140, or the transistors of the PMOS and NMOS S/A driving circuits 125 and 145, are installed perpendicular to the bit line BL. In particular, the MN1 transistors MN1 and MN2 of the gating circuit 140, or the transistors of the PMOS and NMOS S/A driving circuits 125 and 145, are installed in such a way that their gates are perpendicular to the bit line BL. In FIG. 1(b) the gates of the transistors MN1 and MN2 are installed perpendicular to the bit line BL. Accordingly, the transistors MN1 and MN2 of the gating circuit 140 or the transistors of the PMOS and NMOS S/A driving circuits 125 and 145 increase the chip area of a semiconductor memory device by a large percentage.

SUMMARY OF THE INVENTION

At least one exemplary embodiment of the present invention provides a semiconductor memory device that is prevented from having an increased chip size due to the conventional layout of a gating circuit for connecting local input/output (I/O) lines to global I/O lines and the conventional layouts of PMOS and NMOS sense amplifier driving circuits.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

The present invention will now be described more fully hereinafter with reference to the accompanying drawings, in which preferred exemplary embodiments of the invention are shown. However, the embodiments of the present invention can be modified into various other forms, and the scope of the present invention must not be interpreted as being restricted to the described embodiments. The embodiments are provided to more completely explain the present invention to those skilled in the art. Throughout the specification, like numbers refer to like elements.

Figure 1:
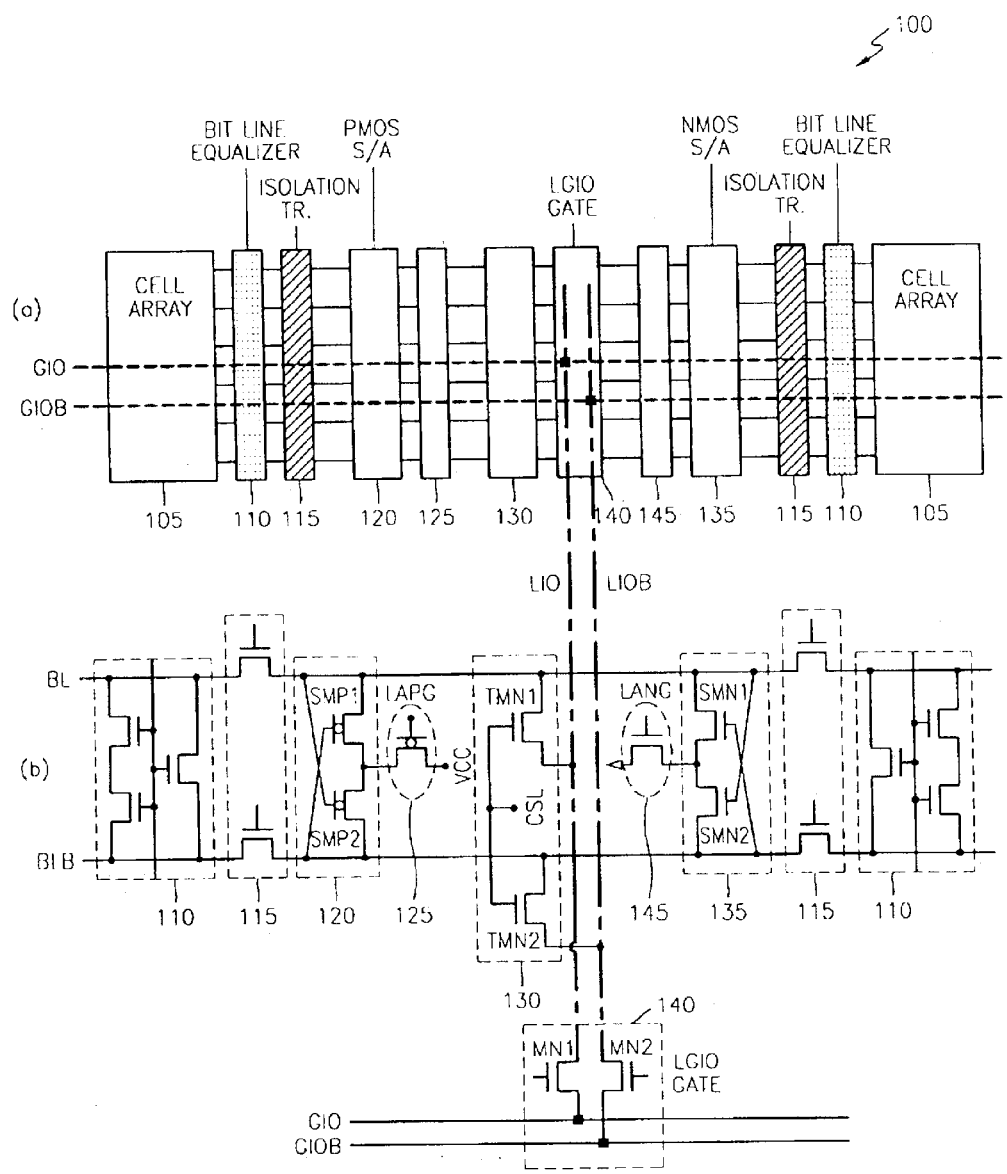
FIG. 1(a) is a block diagram of a conventional semiconductor memory device having local input/output (I/O) lines and global I/O lines.
FIG. 1(b) is a circuit diagram of the conventional semiconductor memory device illustrated in FIG. 1(a)
Figure 2:
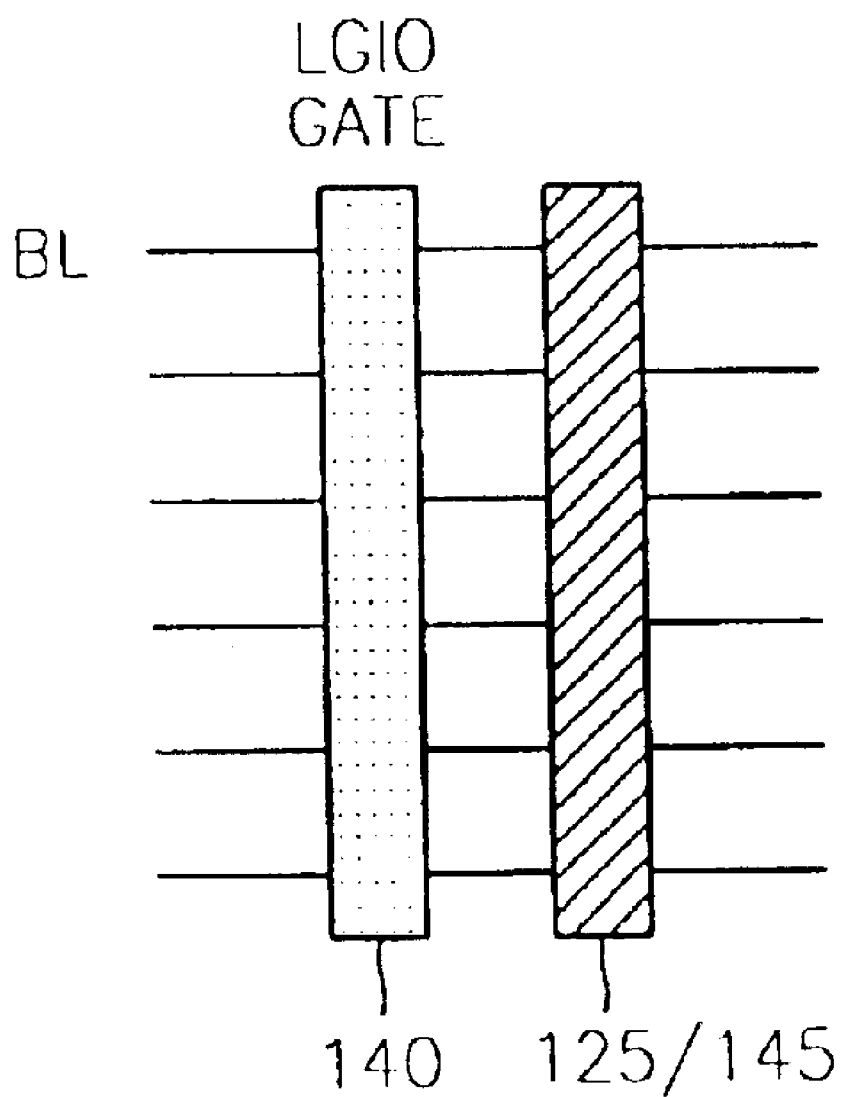
FIG. 2 is a block diagram illustrating the layouts of the gating circuit and NMOS and PMOS sense amplifier driving circuits of FIG. 1(b)

A semiconductor memory device according to a first exemplary embodiment of the present invention includes local input/output (I/O) lines, global I/O lines, and a memory core. The memory core is coupled between a bit line BL and a complementary bit line BLB, and includes a memory cell array, a bit line equalizer circuit, a PMOS sense amplifier (S/A), a PMOS S/A driving circuit for driving the PMOS S/A, a transmission gate circuit, an NMOS S/A, and an NMOS S/A driving circuit for driving the NMOS S/A. In this semiconductor memory device, first and second transistors MN1 and MN2 for connecting the local I/O lines to the global I/O lines are installed between adjacent bit lines. The PMOS S/A driving circuit, which is a first driving transistor, and the NMOS S/A driving circuit, which is a second driving transistor, are also installed between adjacent bit lines. On the other hand, in a conventional semiconductor memory device as shown in FIG. 1(b), the first and second transistors MN1 and MN2 and the first and second driving transistors 125 and 145 are installed perpendicular to the bit lines.

In the first exemplary embodiment of the present invention, the transistors MN1, MN2, 125, and 145 are installed between adjacent bit lines, thus preventing the layout of the semiconductor memory device from being enlarged. That is, in the prior art, because the gates of the transistors MN1, MN2, 125, and 145 are installed perpendicular to the bit lines, the remaining area is not adequately utilized and the entire layout is enlarged. However, in the first exemplary embodiment of the present invention, the gates of the transistors MN1, MN2, 125, and 145 are installed in the space between adjacent bit lines which could not be utilized in the prior art. This prevents additional enlargement in the layout. The transistors MN1, MN2, 125, and 145 can be installed between adjacent bit lines either by installing their gates in parallel to the bit lines or by dividing the width of each of the transistors MN1, MN2, 125, and 145 into parts smaller than the interval between adjacent bit lines and installing each of the parts between the bit lines. Because the gates of transistors MN1, MN2, 125 and 145 are installed between adjacent bit lines, an enlargement of the chip size is prevented.

A first local I/O line LIO is coupled to one terminal of a first transmission transistor TMN1 in the transmission gate circuit 130, which has its other terminal coupled to the bit line BL. A second local I/O line LIOB is coupled to one terminal of a second transmission transistor TMN2 in the transmission gate circuit 130, which has its other terminal coupled to the complementary bit line BLB. A first global I/O line GIO is coupled to one terminal of the first transistor MN1, which has its other terminal coupled to the first local I/O line LIO. A second global I/O line GIOB is coupled to one terminal of the second transistor MN2, which has its other terminal coupled to the second local I/O line LIOB.

The PMOS transistor 125 has a first terminal coupled to the connection node of first and second PMOS transistors SMP1 and SMP2 cross-coupled in the PMOS S/A 120, a second terminal coupled to the supply voltage source VCC, and a gate coupled to the PMOS S/A driving signal LAPG. The NMOS transistor 145 has a first terminal coupled to the connection node of first and second NMOS transistors SMN1 and SMN2 cross-coupled in the NMOS S/A 135, a second terminal coupled to the circuit ground, and a gate coupled to the NMOS S/A driving signal LANG.

Figure 3:
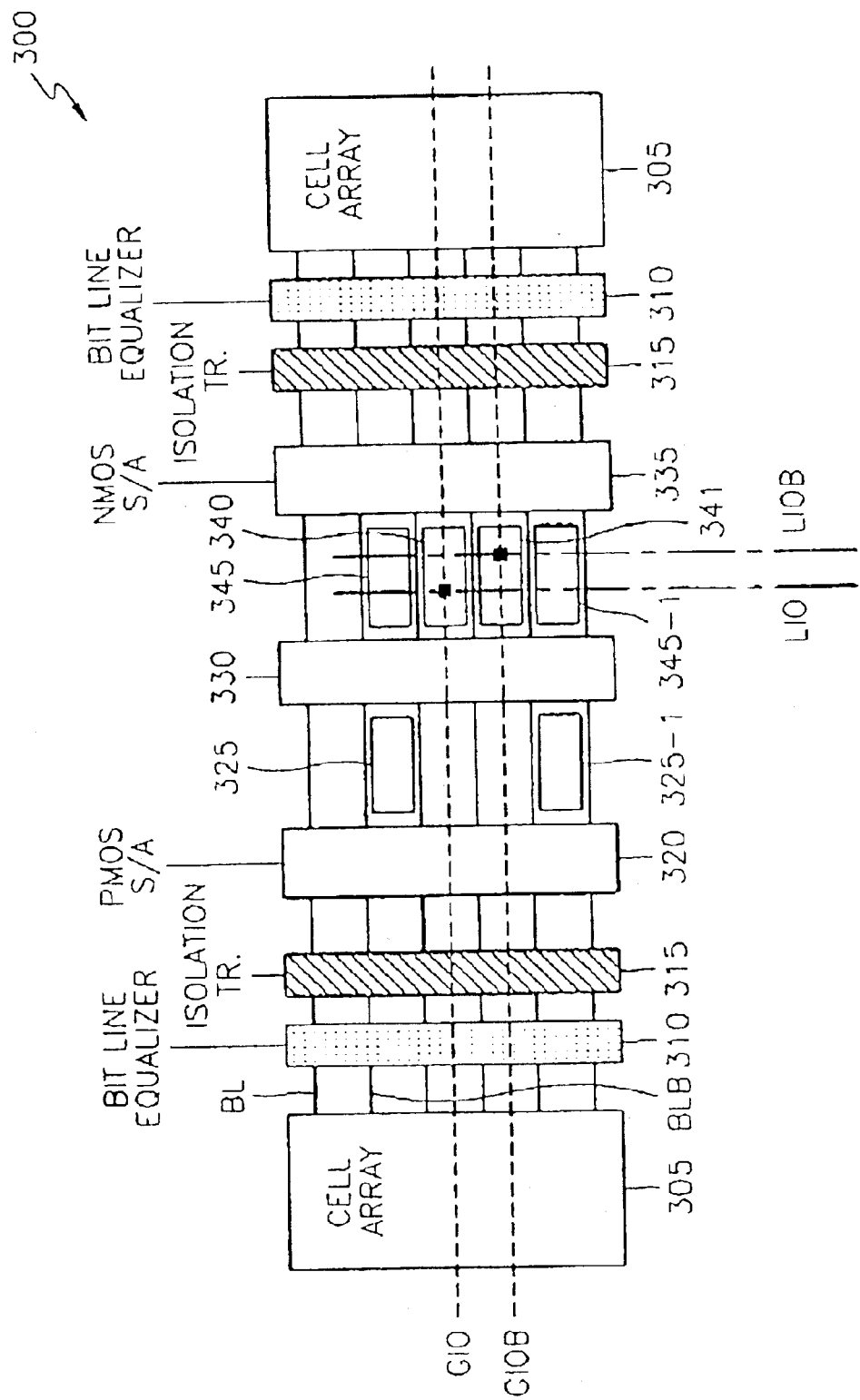
FIG. 3 is a block diagram of a semiconductor memory device according to an exemplary embodiment of the present invention.

In the second through fourth exemplary embodiments of the present invention, the first driving transistor is represented by two reference numerals 325 and 325-1, as shown in FIG. 3, to indicate that the first driving transistor can be installed in either of the places indicated by the reference numerals 325 and 325-1. Similarly, the second driving transistor is represented by two reference numerals 345 and 345-1 to indicate that the second driving transistor can be installed in either of the places indicated by reference numerals 345 and 345-1. That is, as long as the gates of the first and second driving transistors 325, 325-1 and 345, 345-1 are each installed parallel to and between adjacent bit lines, it does not matter where they are installed.

Referring now to FIG. 3, a semiconductor memory device 300 according to a second exemplary embodiment of the present invention can be seen. This exemplary embodiment includes local I/O lines LIO and LIOB, global I/O lines GIO and GIOB, and a memory core. The memory core is coupled between a bit line BL and a complementary bit line BLB, and includes a memory cell array 305, a bit line equalizer circuit 310, a PMOS S/A 320, a PMOS S/A driving circuit 325, 325-1 for driving the PMOS S/A 320, a transmission gate circuit 330, an NMOS S/A 335, and NMOS S/A driving circuit 345, 345-1 for driving the NMOS S/A 335. In this exemplary semiconductor memory device according to the second embodiment the present invention, first and second transistors 340 and 341 for connecting the local I/O lines LIO and LIOB to the global I/O lines GIO and GIOB are installed between adjacent bit lines BL and BLB such that each of their gates is parallel to the bit lines. Such an arrangement of the first and second transistors 340 and 341 can reduce an increase in the layout area of a memory device.

The first and second transistors 340 and 341 are consecutively installed between bit lines as shown in FIG. 3, and can be separated from each other. Therefore, as long as the gates of the first and second transistors 340 and 341 are installed parallel to adjacent bit lines, it does not matter where they are installed.

Figure 4:
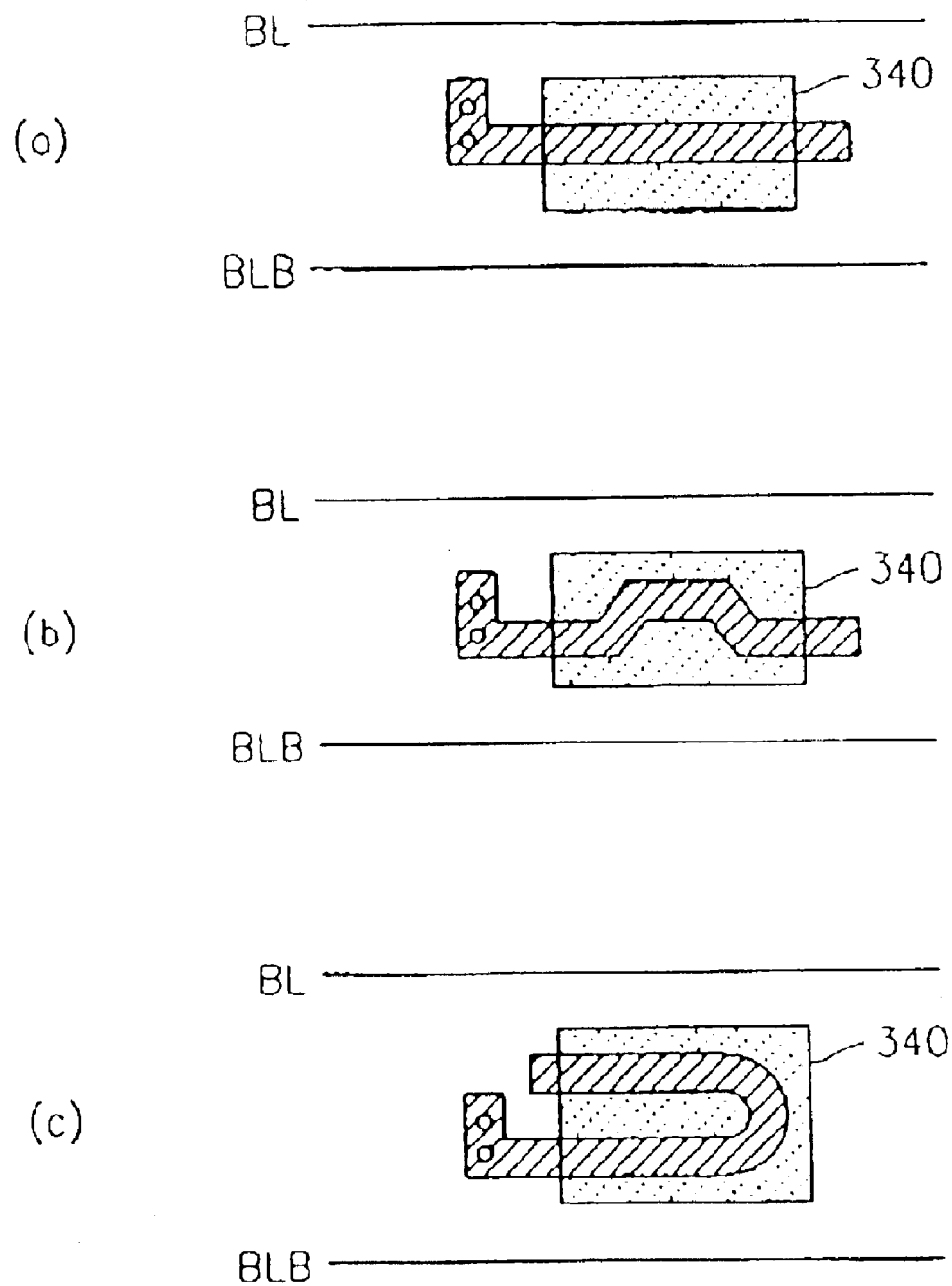
FIG. 4 is a detailed illustration of the transistors shown in FIG. 3 in more detail.

Referring now to FIG. 4, each of the gates (hatched portion) of the first and second transistors 340 and 341 is installed parallel to adjacent bit lines. As long as each of the gates of the first and second transistors 340 and 341 are installed parallel to adjacent bit lines, they can have a variety of shapes, such as are illustrated in FIGS. 4(a), (b) and (c).

In a semiconductor memory device according to a third exemplary embodiment of the present invention, the PMOS S/A driving circuit 325, 325-1, which is a first driving transistor, and the NMOS S/A driving circuit 345, 345-1, which is a second driving transistor, are designed such that each of their gates is installed parallel to and between adjacent bit lines.

As shown in FIGS. 4(a), (b) and (c), the gates of the first driving transistor 325, 325-1 and the second driving transistor 345, 345-1 can each have a variety of shapes as long as each of the gates is installed parallel to adjacent bit lines.

In a semiconductor memory device according to a fourth exemplary embodiment of the present invention, the first and second transistors 340 and 341 for connecting the local I/O lines LIO and LIOB to global I/O lines GIO and GIOB are each installed between adjacent bit lines such that their gates are parallel to the bit lines. In a similar manner, the first driving transistor 325, 325-1 as the PMOS S/A driving circuit, and the second driving transistor 345, 345-1 as the NMOS S/A driving circuit, are each installed between adjacent bit lines such that their gates are parallel to the bit lines.

In the fourth exemplary embodiment of the present invention, as long as the gates of the first and second transistors 340 and 341, the first driving transistor 325, 325-1 and the second driving transistor 345, 345-1 are parallel to the bit lines, the transistors can be installed in any of the spaces between adjacent bit lines. In addition, the gates can have a variety of shapes, as shown in FIGS. 4(*a*), (*b*) and (*c*).

Figure 5:
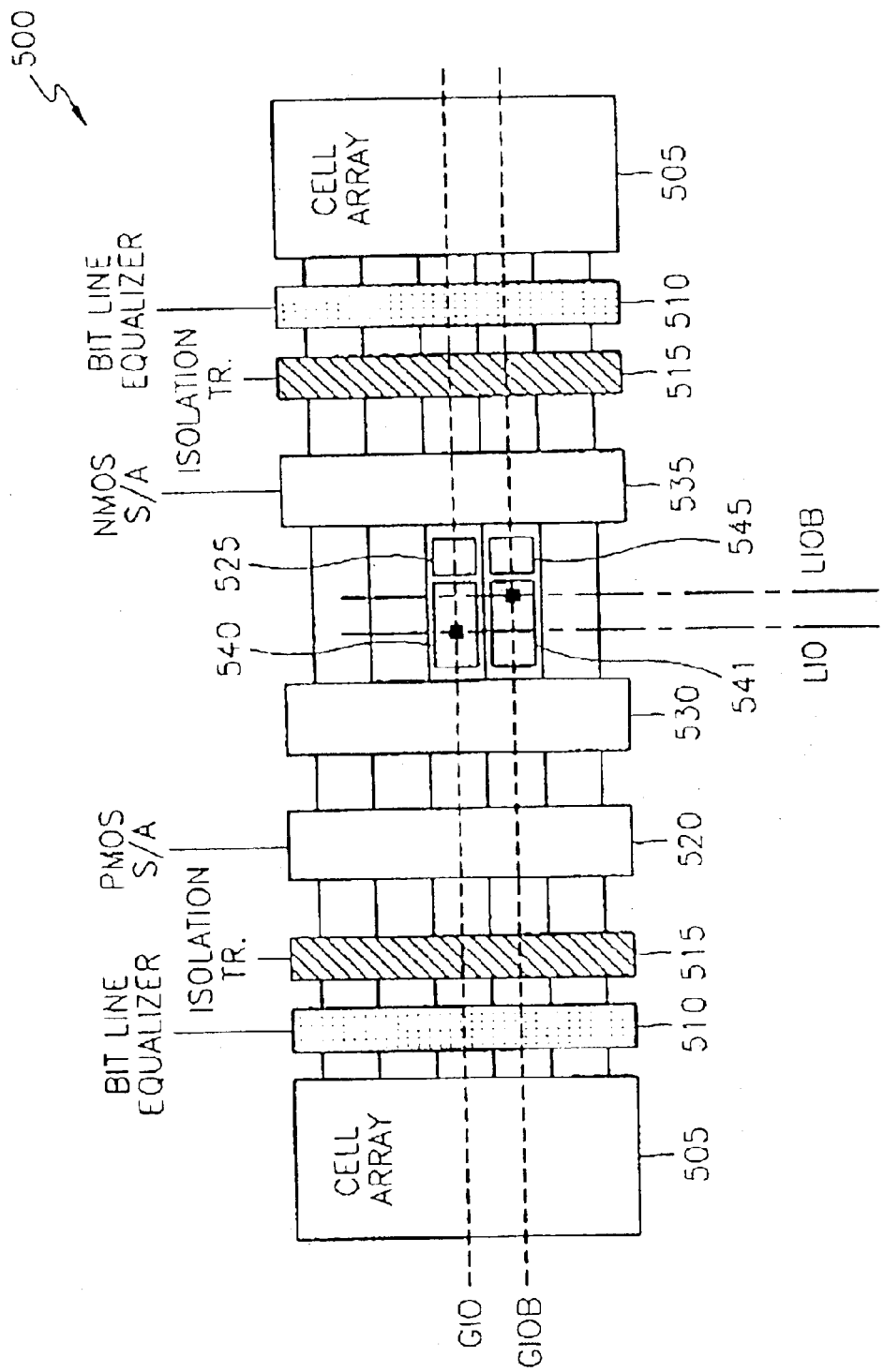
FIG. 5 is a block diagram of a semiconductor memory device according to another exemplary embodiment of the present invention.
Figure 6:
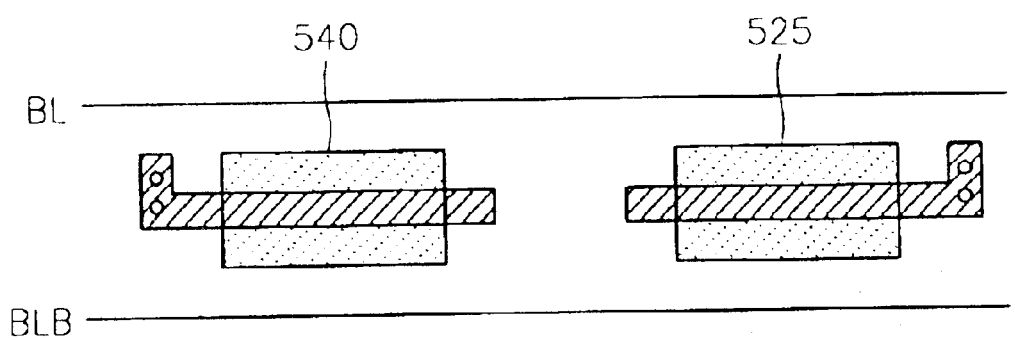
FIG. 6 is a detailed illustration of the transistors illustrated in FIG. 5.

Referring to FIGS. 5 and 6, a semiconductor memory device 500 according to a fifth exemplary embodiment of the present invention can be seen. This exemplary embodiment includes local I/O lines LIO and LIOB, global I/O lines GIO and GIOB, and a memory core. The memory core is coupled between a bit line BL and a complementary bit line BLB, and includes a memory cell array 505, a bit line equalizer circuit 510, a PMOS S/A 520, a PMOS S/A driving circuit 525 for driving the PMOS S/A 520, a transmission gate circuit 530, an NMOS S/A 535, and an NMOS S/A driving circuit 545 for driving the NMOS S/A 535. In this exemplary semiconductor memory device, first and second transistors 540 and 541 for connecting the local I/O lines LIO and LIOB to the global I/O lines GIO and GIOB are each installed between adjacent bit lines such that their gates are parallel to the bit lines. The first driving transistor 525 as the PMOS S/A driving circuit and the second driving transistor 545 as the NMOS S/A driving circuit are each installed between the same bit lines as those for the first and second transistors 540 and 541 and close to the first and second transistors 540 and 541 such that their gates are parallel to the bit lines.

In the semiconductor memory device 500 according to the fifth exemplary embodiment, as shown in FIG. 5, the first transistor 540 and the first driving transistor 525 are installed together between a pair of bit lines, and the second transistor 541 and the second driving transistor 545 are installed together between another pair of bit lines. However, in an alternative exemplary embodiment, the first transistor 540 can be installed with the second driving transistor 545 between a pair of bit lines, and the second transistor 541 can be installed with the first driving transistor 525 between another pair of bit lines.

As in the second through fourth exemplary embodiments of the present invention, if the first and second transistors 540 and 541 are distant from each other and the first and second driving transistors 525 and 545 are distant from each other, the interval between adjacent bit lines may narrow. Accordingly, the adjacent arrangement between the first and second transistors 540 and 541 and between the first and second driving transistors 525 and 545 as in the fifth exemplary embodiment can prevent the interval between bit lines from narrowing. Furthermore, as long as the first transistor 540 is installed across a bit line from the second transistor 541 and the first driving transistor 525 is installed across a bit line from the second driving transistor 545, it does not matter where they are installed.

Referring now to FIG. 6, the first transistor 540 and the first driving transistor 525 are installed horizontally adjacent to each other between adjacent bit lines BL and BLB. The first and second transistors 540 and 541 the first driving transistor 525, and the second driving transistor 545 can each have a gate with various shapes, such as are illustrated in FIGS. 4(*a*), (*b*) and (*c*).

Figure 7:
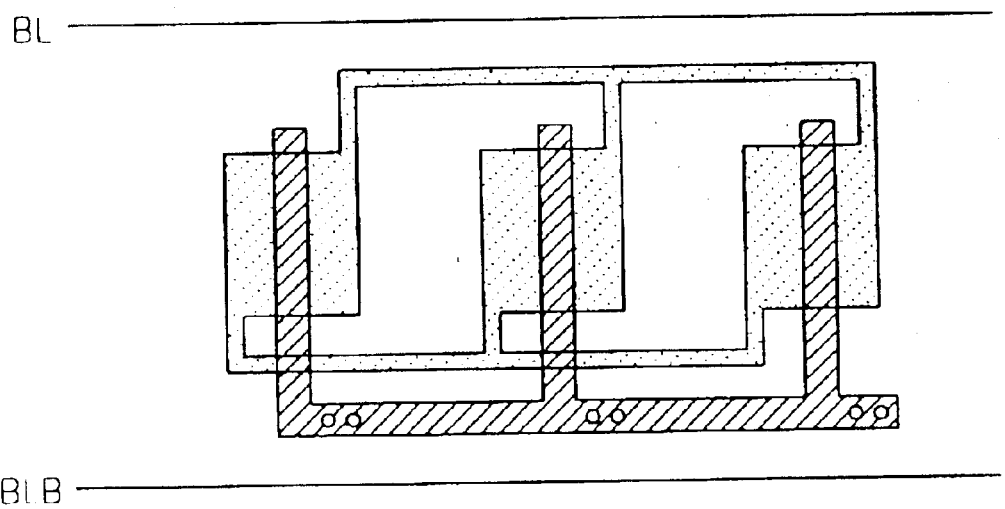
FIG. 7 is a layout of gates arranged perpendicular to and between adjacent bit lines.

FIG. 7 is a layout of gates (hatched portion) arranged perpendicular to and between adjacent bit lines and illustrates a sixth exemplary embodiment of the present invention. This semiconductor memory device according to the sixth exemplary embodiment of the present invention includes N first sub-transistors and M second sub-transistors for connecting local I/O lines to global I/O lines. N and M both denote natural numbers. The first and second sub-transistors are installed between adjacent bit lines such that their gates are perpendicular to the bit lines.

The N first sub-transistors are N equal parts into which the first transistor in the second through fifth exemplary embodiments is divided in width. In other words, if the N first sub-transistors are attached to one another, they form a single first transistor. Likewise, the M second sub-transistors are M equal parts into which the second transistor in the second through fifth exemplary embodiments is divided in width. Similar to the N first sub-transistors, if the M second sub-transistors are attached to one another, they form a single second transistor. Accordingly, if the first and second sub-transistors are cut smaller than the interval between adjacent bit lines and are installed perpendicular to and between adjacent bit lines as in a conventional semiconductor memory device, an increase in the area toward a memory cell array can be prevented even though the transistors are not horizontally installed between bit lines as in the second through fifth exemplary embodiments.

The N first sub-transistors must function in the same manner as a single first transistor by connecting their gates to one another, connecting their sources to one another, and connecting their drains to one another. Similarly, the M second sub-transistors must function in the same manner as a single second transistor by connecting their gates to one another, connecting their sources to one another, and connecting their drains to one another. Such a layout is illustrated in FIG. 7.

The transistor arrangement method for the semiconductor memory device according to the sixth exemplary embodiment is the same as that for the second exemplary embodiment except that, in the sixth exemplary embodiment, the widths of the first and second transistors 340 and 341 are cut smaller than the interval between bit lines and are installed between adjacent bit lines. Thus, the first and second transistors can be installed in any of the spaces between adjacent bit lines.

A semiconductor memory device according to a seventh exemplary embodiment of the present invention includes L first driving sub-transistors constituting a PMOS S/A driving circuit and P second driving sub-transistors constituting an NMOS S/A driving circuit. L and P both denote natural numbers. The first and second driving sub-transistors are installed between adjacent bit lines such that their gates are perpendicular to the bit lines.

The L first driving sub-transistors are L equal parts into which the first driving transistor in the second through fifth exemplary embodiments is divided in width. In other words, if the L first driving sub-transistors are attached to one another, they form a single first driving transistor. The P second driving sub-transistors are P equal parts into which the second driving transistor in the second through fifth exemplary embodiments is divided in width. If the P second driving sub-transistors are attached to one another, they form a single second driving transistor. Accordingly, if the first and second driving sub-transistors are cut smaller than the interval between adjacent bit lines and are installed perpendicular to and between adjacent bit lines as in a conventional semiconductor memory device, an increase in the area toward a memory cell array can be prevented, even though the transistors are not horizontally installed between bit lines as in the second through fifth exemplary embodiments.

The L first driving sub-transistors must function in the same manner as a single first driving transistor by connecting their gates to one another, connecting their sources to one another, and connecting their drains to one another. Similarly, the P second driving sub-transistors must function in the same manner as a single second driving transistor by connecting their gates to one another, connecting their sources to one another, and connecting their drains to one another.

The transistor arrangement method for the semiconductor memory device according to the seventh exemplary embodiment is the same as that for the third exemplary embodiment except that, in the seventh exemplary embodiment, the widths of the first driving transistor (325, 325-1) and the second driving transistor (345, 345-1) in the third exemplary embodiment are cut smaller than the interval between bit lines and the first and second driving transistors are installed between the bit lines. That is, the first and second driving transistors can be installed in any of the spaces between adjacent bit lines.

A semiconductor memory device according to an eighth exemplary embodiment of the present invention includes N first sub-transistors and M second sub-transistors for connecting local I/O lines to global I/O lines, L first driving sub-transistors constituting a PMOS S/A driving circuit, and P second driving sub-transistors constituting an NMOS S/A driving circuit. The first and second sub-transistors and first and second driving sub-transistors are each installed between adjacent bit lines such that their gates are perpendicular to the bit lines.

The semiconductor memory device according to the eighth exemplary embodiment is a combination of the features of the sixth and seventh exemplary embodiments. That is, the first and second sub-transistors and the first and second driving sub-transistors are each installed between adjacent bit lines. The semiconductor memory device according to the eighth exemplary embodiment is the same as the fourth exemplary embodiment in the method of arranging the first and second transistors, i.e., the first and second transistors can be installed in any of the spaces between adjacent bit lines.

A semiconductor memory device according to a ninth exemplary embodiment of the present invention includes N first sub-transistors and M second sub-transistors for connecting local I/O lines to global I/O lines, L first driving sub-transistors constituting a PMOS S/A driving circuit, and P second driving sub-transistors constituting an NMOS S/A driving circuit. The first and second sub-transistors are each installed between adjacent bit lines such that their gates are perpendicular to the bit lines. The first and second driving sub-transistors are each installed between the same bit lines as those for the first and second sub-transistors and close to the first and second sub-transistors such that their gates are perpendicular to the bit lines.

Similar to the semiconductor memory device according to the fifth exemplary embodiment in which the first and second transistors 540 and 541 are installed together with the first and second driving transistor (525 and 545 respectively) between adjacent bit lines, in the semiconductor memory device according to the ninth exemplary embodiment, the first sub-transistors can be installed between adjacent bit lines together with the first driving sub-transistors or the second driving sub-transistors. The second sub-transistors can be installed between adjacent bit lines together with the first driving sub-transistors or the second driving sub-transistors.

As in the sixth through eighth exemplary embodiments, if the first and second sub-transistors are located distant from each other and the first and second driving sub-transistors are also located distant from each other, the interval between adjacent bit lines may narrow. Accordingly, the adjacent arrangement between the first and second sub-transistors and between the first and second driving sub-transistors as in the ninth exemplary embodiment can prevent the interval between bit lines from narrowing. Furthermore, long as the first sub-transistors are installed across a bit line from the second sub-transistors and the first driving sub-transistors are installed across a bit line from the second driving sub-transistors, it does not matter where they are installed.

The first transistor 540 and the first driving transistor 525 are installed horizontally adjacent to each other between adjacent bit lines BL and BLB, such as is illustrated in FIG. 6. In addition, the first and second transistors 540 and 540-1 and the first and second driving transistors 525 and 545 can each have a gate with various shapes such as are shown FIGS. 4(a), (b) and (c).

As described above, an exemplary semiconductor memory device according to the present invention arranges a PMOS sense amplifier driving circuit, an NMOS sense amplifier driving circuit, and a gating circuit for connecting local I/O lines to global I/O lines between adjacent bit lines, thereby reducing the chip area.

While this invention has been particularly shown and described with reference to preferred embodiments thereof, it will be understood by those ordinarily skilled in the art that various changes in form and details may be made therein without departing from the spirit and scope of the invention as defined by the appended claims.

What is claimed is:

1. A semiconductor memory device having a reduced chip size comprising:
   local input/output (I/O) lines,
   global I/O lines, and
   a memory core, said memory core being coupled between a bit line and a complementary bit line, said memory core including a memory cell array, a bit line equalizer circuit, a PMOS sense amplifier (S/A), a PMOS S/A driving circuit for driving the PMOS S/A, a transmission gate circuit, an NMOS S/A, and an NMOS S/A driving circuit for driving the NMOS S/A,
   wherein first and second transistors for connecting said local I/O lines to said global I/O lines are installed in a space between adjacent bit lines, and
   wherein the PMOS S/A driving circuit and the NMOS S/A driving circuit are installed in a space between adjacent bit lines.

2. The semiconductor memory device of claim 1, wherein said PMOS S/A driving circuit is a first driving transistor and said NMOS S/A driving circuit is a second driving transistor.

3. The semiconductor memory device of claim 1, wherein said first and second transistors, said PMOS S/A driving circuit, and said NMOS S/A driving circuit are installed between said adjacent bit lines such that the gates of said first and second transistors and the gates of said PMOS S/A driving circuit and said NMOS S/A driving circuit are not perpendicular to said bit lines.

4. The semiconductor memory device of claim 1, wherein a first local I/O line in a pair of local I/O lines is coupled to one terminal of a first transmission transistor in the transmission gate circuit, which has a second terminal coupled to said bit line, and wherein a second local I/O line in said pair of local I/O lines is coupled to one terminal of a second transmission transistor in the transmission gate circuit, which has a second terminal coupled to said complementary bit line.

5. The semiconductor memory device of claim 4, wherein a first global I/O line in a pair of said global I/O lines is coupled to one terminal of the first transistor, which has a second terminal coupled to the first local I/O line, and wherein a second global I/O line in said pair of global I/O lines is coupled to one terminal of the second transistor, which has a second terminal coupled to the second local I/O line.

6. The semiconductor memory device of claim 2, wherein said first driving transistor has a first terminal coupled to a connection node of said first and second PMOS transistors, a second terminal coupled to a supply voltage source, and a gate coupled to a PMOS S/A driving signal, said first and second PMOS transistors being cross-coupled in said PMOS S/A.

7. The semiconductor memory device of claim 2, wherein the second driving transistor has a first terminal coupled to a connection node of said first and second NMOS transistors, a second terminal coupled to a circuit ground, and a gate coupled to a NMOS S/A driving signal, said first and second NMOS transistors being cross-coupled in the NMOS S/A.

8. A semiconductor memory device having a reduced chip size comprising:
   local input/output (I/O) lines,
   global I/O lines, and
   a memory core, said memory core being coupled between a bit line and a complementary bit line, said memory core including a memory cell array, a bit line equalizer circuit, a PMOS S/A, a PMOS S/A driving circuit for driving the PMOS S/A, a transmission gate circuit, an NMOS S/A, and an NMOS S/A driving circuit for driving the NMOS S/A,
   wherein first and second transistors for connecting the local I/O lines to the global I/O lines are each installed between said adjacent bit lines such that their gates are parallel to said adjacent bit lines.

9. The semiconductor memory device of claim 8, wherein said first and second transistors are consecutively installed between said adjacent bit lines and are separated from each other.

10. A semiconductor memory device having a reduced chip size comprising:
    local input/output (I/O) lines,
    global I/O lines, and
    a memory core, said memory core being coupled between a bit line and a complementary bit line, said memory core including a memory cell array, a bit line equalizer circuit, a PMOS S/A, a PMOS S/A driving circuit for driving the PMOS S/A, a transmission gate circuit, an NMOS S/A, and an NMOS S/A driving circuit for driving the NMOS S/A,
    wherein the PMOS S/A driving circuit and the NMOS S/A driving circuit are installed between adjacent bit lines such that their gates are parallel to said adjacent bit lines.

11. The semiconductor memory device of claim 10, wherein said PMOS S/A driving circuit is a first driving transistor and said NMOS S/A driving circuit is a second driving transistor.

12. A semiconductor memory device having a reduced chip size comprising:
    local input/output (I/O) lines,
    global I/O lines, and
    a memory core, said memory core being coupled between a bit line and a complementary bit line and including a memory cell array, a bit line equalizer circuit, a PMOS S/A, a PMOS S/A driving circuit for driving the PMOS S/A, a transmission gate circuit, an NMOS S/A, and an NMOS S/A driving circuit for driving the NMOS S/A,
    wherein first and second transistors for connecting the local I/O lines to the global I/O lines are installed between adjacent bit lines such that their gates are parallel to said adjacent bit lines, and
    wherein the PMOS S/A driving circuit, which is a first driving transistor, and the NMOS S/A driving circuit, which is a second driving transistor, are also installed between said adjacent bit lines such that their gates are parallel to said adjacent bit lines.

13. A semiconductor memory device having a reduced chip size comprising:
    local input/output (I/O) lines,
    global I/O lines, and
    a memory core, said memory core being coupled between a bit line and a complementary bit line, said memory core including a memory cell array, a bit line equalizer circuit, a PMOS S/A, a PMOS S/A driving circuit for driving the PMOS S/A, a transmission gate circuit, an NMOS S/A, and an NMOS S/A driving circuit for driving the NMOS S/A,
    wherein first and second transistors for connecting the local I/O lines to the global I/O lines are installed between adjacent bit lines such that their gates are parallel to said adjacent bit lines, and
    wherein said PMOS S/A driving circuit and said NMOS S/A driving circuit are installed between said same adjacent bit lines next to said first and second transistors such that their gates are parallel to said adjacent bit lines.

14. The semiconductor device of claim 13, wherein said PMOS S/A driving circuit is a first driving transistor and said NMOS S/A driving circuit is a second driving transistor.

15. The semiconductor memory device of claim 14, wherein said first transistor and said first driving transistor are installed between a pair of bit lines and said second transistor and said second driving transistor are installed between another pair of bit lines.

16. The semiconductor memory device of claim 15, wherein said first transistor is installed across a bit line from said second transistor and said first driving transistor is installed across a bit line from said second driving transistor.

17. The semiconductor memory device of claim 14, wherein said first transistor and said second driving transistor are installed between a pair of bit lines and said second transistor and said first driving transistor are installed between another pair of bit lines.

18. A semiconductor memory device having a reduced chip size comprising:
    local input/output (I/O) lines;
    global I/O lines;
    N first sub-transistors and M second sub-transistors for connecting the local I/O lines to the global I/O lines; and
    a memory core, said memory core being coupled between a bit line and a complementary bit line, said memory core including a memory cell array, a bit line equalizer circuit, a PMOS S/A, a PMOS S/A driving circuit for driving the PMOS S/A, a transmission gate circuit, an NMOS S/A, and an NMOS S/A driving circuit for driving the NMOS S/A, wherein N and M represent natural numbers; and wherein said N first sub-transistors and said M second sub-transistors are installed between adjacent bit lines such that their gates are perpendicular to said adjacent bit lines.

19. The semiconductor memory device of claim 18, wherein the width of each of said first and second sub-transistors is smaller than the interval between said adjacent bit lines.

20. The semiconductor memory device of claim 18, wherein the gates of said N first sub-transistors are coupled to each other, the sources are coupled to each other, and the drains are coupled to each other so that said N first sub-transistors function as a single first transistor; and wherein the gates of said M second sub-transistors are coupled to each other, the sources are coupled to each other, and the drains are coupled to each other so that said M second transistors function as a single second transistor.

21. A semiconductor memory device having a reduced chip size comprising:

local input/output (I/O) lines;

global I/O lines; and a memory core, said memory core being coupled between a bit line and a complementary bit line, said memory core including a memory cell array, a bit line equalizer circuit, a PMOS S/A, a PMOS S/A driving circuit for driving the PMOS S/A, a transmission gate circuit, an NMOS S/A, and an NMOS S/A driving circuit for driving the NMOS S/A;

wherein said PMOS S/A driving circuit includes L first driving sub-transistors and said NMOS S/A driving circuit includes P second driving sub-transistors, said L first driving sub-transistors and said P second driving sub-transistors being installed between adjacent bit lines such that their gates are perpendicular to said adjacent bit lines; and wherein L and P represent natural numbers.

22. The semiconductor memory device of claim 21, wherein the width of each of said first and second driving sub-transistors is smaller than the interval between said adjacent bit lines.

23. The semiconductor memory device of claim 21, wherein the gates of the L first driving sub-transistors are coupled to each other, the sources are coupled to each other, and the drains are coupled to each other so that said L first driving sub-transistors function as a single first transistor, and wherein the gates of said P second driving sub-transistors are coupled to each other, the sources are coupled to each other, and the drains are coupled to each other so that said P second driving sub-transistors function as a single second transistor.

24. A semiconductor memory device having a reduced chip size comprising:

local input/output (I/O) lines;

global I/O lines;

N first sub-transistors and M second sub-transistors for connecting the local I/O lines to the global I/O lines; and a memory core, said memory core being coupled between a bit line and a complementary bit line, said memory core including a memory cell array, a bit line equalizer circuit, a PMOS S/A, a PMOS S/A driving circuit for driving the PMOS S/A, a transmission gate circuit, an NMOS S/A, and an NMOS S/A driving circuit for driving the NMOS S/A;

wherein said PMOS S/A driving circuit includes L first driving sub-transistors and said NMOS S/A driving circuit includes P second driving sub-transistors, said first and second sub-transistors and first and second driving sub-transistors each being installed between adjacent bit lines such that their gates are perpendicular to said adjacent bit lines; and wherein N, M, L, and P denote natural numbers.

25. The semiconductor memory device of claim 24, wherein the width of each of said first and second sub-transistors and first and second driving sub-transistors is smaller than the interval between said adjacent bit lines.

26. The semiconductor memory device of claim 24, wherein said N first sub-transistors have gates coupled together, sources coupled together, and drains coupled together so that said N first sub-transistors function as a single first transistor, wherein said M second sub-transistors have gates coupled together, sources coupled together and drains coupled together so that said M second sub-transistors function as a single second transistor, wherein said L first driving sub-transistors have gates coupled together, sources coupled together, and drains coupled together so that said L first driving sub-transistors function as a single first driving transistor, and wherein said P second driving sub-transistors have gates coupled together, sources coupled together and drains coupled together so that said P second driving sub-transistors function as a single second driving transistor.

27. A semiconductor memory device having a reduced chip size comprising:

local input/output (I/O) lines;

global I/O lines;

N first sub-transistors and M second sub-transistors for connecting the local I/O lines to the global I/O lines; and a memory core, said memory core being coupled between a bit line and a complementary bit line, said memory core including a memory cell array, a bit line equalizer circuit, a PMOS S/A, a PMOS S/A driving circuit for driving the PMOS S/A, a transmission gate circuit, an NMOS S/A, and an NMOS S/A driving circuit for driving the NMOS S/A, wherein said PMOS S/A driving circuit includes L first driving sub-transistors and said NMOS S/A driving circuit includes P second driving sub-transistors, said first and second sub-transistors each being installed between adjacent bit lines such that their gates are perpendicular to said adjacent bit lines, and said first and second driving sub-transistors each being installed between said same adjacent bit lines and next to said first and second sub-transistors such that their gates are perpendicular to said adjacent bit lines; and wherein N, M, L, and P denote natural numbers.

28. The semiconductor memory device of claim 27, wherein the width of each of said first and second sub-transistors and first and second driving sub-transistors is smaller than the interval between said adjacent bit lines.

29. The semiconductor memory device of claim 27, wherein said N first sub-transistors have gates coupled together, sources coupled together, and drains coupled together so that said N first sub-transistors function as a single first transistor, wherein said M second sub-transistors have gates coupled together, sources coupled together, and drains coupled together so that said M second sub-transistors function as a single second transistor, wherein said L first driving sub-transistors have gates coupled together, sources coupled together, and drains coupled together so that said L first driving sub-transistors function as a single first driving transistor, and wherein said P second driving sub-transistors have gates coupled together, sources coupled together and drains coupled together so that said P second driving sub-transistors function as a single second driving transistor.

30. A semiconductor memory device having a reduced chip size comprising:

local input/output (I/O) lines;

global I/O lines;

a memory core including first and second driving circuits; and first and second transistors for connecting said local I/O lines to said global I/O lines;

wherein at least one of said first and second driving circuits and at least one of said first and second transistors are installed in a space between adjacent bit lines.

31. The semiconductor memory device of claim 30, wherein said first and second driving circuits and said first and second transistors are installed between said adjacent bit lines.

32. The semiconductor memory device of claim 30, wherein said at least one of said first and second driving circuits and said first and second transistors are installed between said adjacent bit lines such that their gates are parallel to said adjacent bit lines.

33. The semiconductor memory device of claim 30, wherein said first and second transistors are installed between adjacent bit lines such that their gates are parallel to said adjacent bit lines, and wherein said first and second driving circuits are installed between said adjacent bit lines such that their gates are parallel to said adjacent bit lines.

34. The semiconductor memory device of claim 30, wherein said first and second driving circuits are installed between said adjacent bit lines and next to said first and second transistors such that the gates of said first and second driving circuits and said first and second transistors are parallel to said adjacent bit lines.

35. The semiconductor memory device of claim 34, wherein said first transistor and said first driving circuit are installed between a pair of bit lines and said second transistor and said second driving circuit are installed between another pair of bit lines.

36. The semiconductor memory device of claim 35, wherein said first transistor is installed across a bit line from said second transistor and said first driving circuit is installed across a bit line from said second driving circuit.

37. The semiconductor memory device of claim 30, wherein said first transistor and said second driving circuit are installed between a pair of bit lines and said second transistor and said first driving circuit are installed between another pair of bit lines.

38. The semiconductor memory device of claim 30, wherein said memory core further comprises a memory cell array, a bit line equalizer circuit, a PMOS sense amplifier (S/A), a transmission gate circuit, and an NMOS S/A.

39. The semiconductor memory device of claim 30, wherein said at least one of said first and second driving circuits and said first and second transistors are installed between adjacent bit lines such that the gates of said first and second transistors and the gates of said first and second driving circuits are not perpendicular to said adjacent bit lines.

40. The semiconductor memory device of claim 30, wherein the first and second driving circuits are installed between the adjacent bit lines.

41. The semiconductor memory device of claim 30, wherein the first and second transistors are installed between the adjacent bit lines.

42. A semiconductor memory device having a reduced chip size comprising:

local input/output (I/O) lines;

global I/O lines;

a memory core including L first driving sub-transistors and P second driving sub-transistors; and N first sub-transistors and M second sub-transistors;

wherein at least one of said first and second driving sub-transistors and at least one of said first and second sub-transistors are installed in a space between adjacent bit lines such that their gates are perpendicular to said adjacent bit lines; and wherein L, M, N, and P are natural numbers.

43. The semiconductor memory device of claim 42, wherein the width of each of said first and second sub-transistors and said first and second driving sub-transistors is smaller than the interval between said adjacent bit lines.

44. The semiconductor memory device of claim 42, wherein the gates of said N first sub-transistors are coupled to each other, the sources are coupled to each other, and the drains are coupled to each other so that said N first sub-transistors function as a single first transistor;

wherein the gates of said M second sub-transistors are coupled to each other, the sources are coupled to each other, and the drains are coupled to each other so that said M second sub-transistors function as a single second transistor;

wherein the gates of said L first driving sub-transistors are coupled to each other, the sources are coupled to each other, and the drains are coupled to each other so that said L first driving sub-transistors function as a single first driving transistor; and wherein the gates of said P first driving sub-transistors are coupled to each other, the sources are coupled to each other, and the drains are coupled to each other so that said P first driving sub-transistors function as a single first driving transistor.

45. The semiconductor memory device of claim 42, wherein first and second driving sub-transistors and said first and second sub-transistors are installed in a space between adjacent bit lines such that their gates are perpendicular to said adjacent bit lines.

46. The semiconductor memory device of claim 42, wherein said first and second sub-transistors are installed between adjacent bit lines such that their gates are perpendicular to said adjacent bit lines, said first sub-transistors being installed across a bit line from said second sub-transistors, and wherein said first and second driving sub-transistors are installed between the same adjacent bit lines as said first and second sub-transistors and next to said first and second sub-transistors such that their gates are perpendicular to said adjacent bit lines, said first driving sub-transistors being installed across a bit line from said second driving sub-transistors.

47. The semiconductor memory device of claim 42, wherein said first sub-transistors and said second sub-transistors are installed between different adjacent bit lines such that their gates are perpendicular to said adjacent bit lines.

48. The semiconductor memory device of claim 47, wherein said first driving sub-transistors are installed between the same bit lines as said first sub-transistors and said second driving sub-transistors are installed between the same bit lines as said second sub-transistors.

49. The semiconductor memory device of claim 47, wherein said first driving sub-transistors are installed between the same bit lines as said second sub-transistors and said second driving sub-transistors are installed between the same bit lines as said first sub-transistors.

50. The semiconductor memory device of claim 42, wherein the first and second driving sub-transistors are installed between the adjacent bit lines.

51. The semiconductor memory device of claim 42, wherein the first and second sub-transistors are installed between the adjacent bit lines.

* * * * *